United States Patent [19]

Kitamoto et al.

[11] Patent Number: 4,626,315

[45] Date of Patent: Dec. 2, 1986

[54] PROCESS OF FORMING ULTRAFINE PATTERN

[75] Inventors: Tatsuji Kitamoto, Kanagawa; Hiroshi Amari, Tokyo; Akira Nahara, Kanagawa; Ryuji Shirahata, Kanagawa; Yoshihiro Arai, Kanagawa, all of Japan

[73] Assignee: Fuji Photo Film Co., Ltd., Kanagawa, Japan

[21] Appl. No.: 796,124

[22] Filed: Nov. 8, 1985

[30] Foreign Application Priority Data

Nov. 9, 1984 [JP] Japan .................. 59-236393
Dec. 12, 1984 [JP] Japan .................. 59-261400

[51] Int. Cl.[4] .................. H01L 21/306; B44C 1/22; C03C 15/00; C23F 1/00
[52] U.S. Cl. .................. 156/628; 156/635; 156/643; 156/646; 156/653; 156/656; 156/657; 156/662; 156/659.1; 204/192.3; 219/121 EM; 219/121 LM; 250/492.1.492.2; 250/492.3; 427/35; 427/43.1; 427/53.1
[58] Field of Search .............. 156/635, 643, 646, 653, 156/656, 657, 659.1, 662, 663, 668, 628; 250/492.1, 492.2, 492.3; 427/35, 43.1, 53.1, 54.1, 36; 219/121 EJ, 121 EK, 121 EM, 121 LJ, 121 LK, 121 LM; 204/192 EC, 192 E

[56] References Cited

U.S. PATENT DOCUMENTS 4,319,954  3/1982  White et al. .................. 156/628
4,530,734  7/1985  Klima .................. 156/628

FOREIGN PATENT DOCUMENTS 0204536  11/1983  Japan .................. 156/628

*Primary Examiner*—William A. Powell
*Attorney, Agent, or Firm*—Sughrue, Mion, Zinn, Macpeak and Seas

[57] ABSTRACT

A process for forming an ultrafine pattern on a surface of a substrate, which includes steps of irradiating the substrate surface with radiation modulated according to information to be patterned, subjecting the substrate surface to deposition with a material reactive or not with the substrate, and subjecting the substrate surface to etching if a substrate-reactive material is used for deposition. By this process, an ultrafine pattern can easily be formed with a high accuracy.

10 Claims, 2 Drawing Figures

PROCESS OF FORMING ULTRAFINE PATTERN

BACKGROUND OF THE INVENTION

The present invention relates to a process for forming an ultrafine pattern by a combination of selective irradiation, deposition and etching. More particularly, the invention relates to a process for forming an ultrafine pattern suitable for the production of high-density integrated circuits.

Photolithography has commonly been used for formation of a patterned thin layer on the surface of a substrate. Photolithography for the formation of a pattern composed of, for example, a silicon dioxide film on a substrate in the form of, for example, a silicon wafer ordinarily includes steps of:

(a) coating a photoresist film on the substrate,
(b) superposing a mask on the photoresist film and exposing the photoresist film through the mask to light emitted from an ultra-high pressure mercury lamp, etc. to print the pattern of the mask on the photoresist film,
(c) removing the uncured photoresist film on the unexposed areas,
(d) etching the silicon dioxide film, and
(e) removing the photoresist film.

Apart from the above-described steps, photolithography involves steps of preparing a mask to be used in the step (b) above. The step (b) is frequently carried out by irradiation with X-rays, etc. The above-described conventional processes are, however, accompanied by the disadvantages that the pattern-formation processes require many steps, including the preparation of a mask, and much difficulty is encountered in forming an ultrafine pattern of submicron dimensions. Moreover, although extensive development efforts regarding the formation of fine patterns by photolithographic techniques have hitherto been made, the patterns obtained by the conventional processes have a lower dimensional limit of about 0.1 $\mu$m.

In order to form a finer pattern, there has recently been proposed a process in which radiation condensed into a narrow beam is selectively irradiated onto the substrate, and then another material is deposited on the substrate to form a fine pattern. This process is based on the principle that stable absorption sites for the material to be deposited are formed by the radiation and that the deposited and heated atoms move on the surface of the substrate to the stable adsorption sites. As a result, this process cannot be applied to cases where the materials to be deposited are reactive with the substrate.

SUMMARY OF THE INVENTION

An object of this invention is to provide a process for easily forming a fine pattern of the submicron order.

In one embodiment of this invention, a pattern is first formed by irradiating a substrate with radiation modulated according to the information to be patterned, after which the substrate surface is subjected to a deposition treatment to form deposited areas and non-deposited areas in correspondence with the non-irradiated areas and irradiated areas, respectively. Finally, a film provided on the substrate is subjected to an etching treatment to thereby form a pattern on the substrate surface.

In another embodiment of this invention, an ultrafine pattern is formed by irradiating a substrate with radiation and depositing a material having reactivity to the substrate material onto the substrate.

DETAILED DESCRIPTION OF THE PREFERRED EMBODIMENTS

The process according to the present invention is illustrated below with reference to FIGS. 1A and 1B.

Figure 1A:
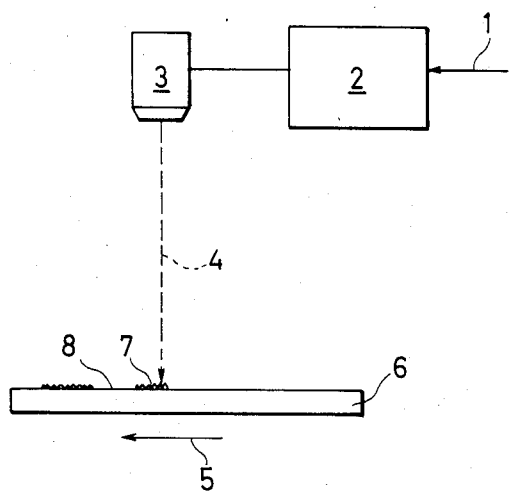
FIGS. 1A and 1B are each a schematic view illustrating the pattern-formation process according to the present invention.
Figure 1B:
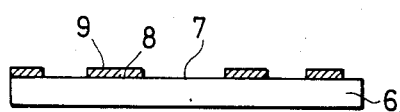

In FIG. 1A, an input signal 1, indicative of information to be recorded, is applied to a radiation generator 3 via a modulator 2. Radiation 4, modulated according to the signal 1 to be recorded, is directed onto the surface of the substrate 6 while the latter is being moved in the direction of an arrow 5, thereby forming an irradiated area 7 and a non-irradiated area 8. The substrate is then subjected to a deposition treatment whereby deposition is not effected in the irradiated area 7.

In the first embodiment of this invention, the substrate, having formed thereon deposited areas, is then etched using any known technique, such as chemical etching, electrolytic etching, gaseous phase etching, and the like. Upon etching under proper conditions, the substrate is eroded deeply in the non-deposited areas and shallowly in the deposited areas to thereby form a pattern corresponding to that of the radiation.

The radiation which can be used in the present invention includes $\alpha$-rays, $\beta$-rays, $\gamma$-rays, electron rays, laser beams, X-rays, ion particle beams, neutron beams, and proton beams. Of these, electron beams are particularly preferred.

The substrate used in the practice of the invention can be selected from among semiconductors such as Si, Ge, GaAs, etc.; metals, e.g., Cu, Al, Fe, Ni, Co, Au, Sn, Pb, Mo, W, V, etc., and alloys of these metals; and inorganic materials, e.g., glass, polymers, etc. The surface of the substrate may be coated with a thin film.

The material to be deposited on the substrate in accordance with the first embodiment of the invention may be a metal such as Cu, Al, Fe, Ni, Co, Au, Sn, Pb, Mo, W, V, etc., and alloys of these metals.

The material to be deposited on the substrate in accordance with a second embodiment of the invention should be reactive with the substrate material. The substrate material and the material reactive therewith can be selected from a wide variety of combinations. It is preferable in some cases, depending on the combination of the substrate and the reactive material to be deposited thereon, that the substrate be heated during the deposition treatment.

For the purpose of ensuring accuracy in the formation of a fine pattern, the substrate after deposition is heated if necessary. The heating temperature should be chosen in accordance with the type of material of the substrate and the deposited material. For example, in a case where the reaction between the substrate and the material to be deposited is carried out at low temperatures, the heating temperature may also be low.

The mechanism which prevents deposition from being effected in the areas where radiation has been applied is not clear, but it is considered that irradiation of electron beams, etc., on the substrate surface may render the irradiated area unstable for the formation of a deposited film. Particularly in the case of using electron beams, a clear distinction between deposited areas and non-deposited areas can be ensured by the presence of an oil in a vacuum pump emloyed for maintaining the substrate in a vacuum atmosphere. The preferred oils used as the vacuum pump oil are hydrocarbons, such as alkylnaphthalenes, eicosylnaphthalene, etc.; silicone oils, such as phenylmethyl polysiloxane, pentaphenyltrimethyl trisiloxane, pentaphenyltrimethyl trisiloxane; etc.; and ester-type oils, such as di-2-ethylhexyl sebacate, di-2-ethylhexyl phthalate, etc.

In addition to the use of the above-described vacuum pump oil, it is also preferable to perform irradiation of the energy beam, such as an electron beam, in a vacuum atmosphere containing a trace amount of an organic gas, e.g., styrene.

The present invention will now be illustrated in greater detail with reference to the following examples, but it should be noted that these examples are not limitive of the present invention.

EXAMPLE 1

A substrate composed of a silicon wafer having coated thereon a silicon dioxide film was irradiated with a modulated electron beam under conditions of an accelerating voltage of 25 KV, a beam current of 50 pA and a beam diameter of 200 A using a scanning-type electron microscope in a vacuum atmosphere created by evacuation with a cryopump. Thereafter, chromium was deposited on the substrate to a thickness of 80 A, and the substrate was heated to 100° C. The substrate thus treated was etched in a plasma etching apparatus by introducing carbon tetrafluoride gas to cause electric discharge. By this etching, the silicon dioxide film on the areas that were not coated with a chromium film was removed. The etching conditions and the chromium film thickness were selected so that the chromium film on the SiO$_2$-coated substrate could also be removed by the etching.

It was confirmed with a scanning-type electron microscope that the substrate had formed thereon the same pattern as the electron beam pattern.

EXAMPLE 2

A substrate composed of a silicon wafer was irradiated with an electron beam under conditions of an accelerating voltage of 30 KV, an electron beam current of 10 pA and a beam diameter of about 50 A. The irradiation was carried out by scanning in a square area of 5 $\mu$m $\times$ 5 $\mu$m for 5 minutes in such a manner that the scan lines formed a striped pattern with an interval of 150 A between adjacent lines within the area. During the scanning, the beam was shielded each time the beam was shifted to another scan line. The substrate was deposited with nickel to a thickness of 60 A at a substrate temperature of 30° C., and the substrate was then heated while observing the surface thereof through a scanning-type electron microscope. These operations were carried out in a vacuum atmosphere obtained by an evacuation system using a combination of a rotary pump and a diffusion pump. Through electron-microscopic observation, a striped pattern made of nickel lines having a width of about 80 A was noted in the non-irradiated part of the square area when the heating temperature reached 250° C.

As the heating temperature was further elevated, the width of the Ni lines gradually became narrower. When the heating temperature reached 650° C., nickel was not observed at all and, instead, an ultrafine pattern made of a newly produced reaction product was observed.

Thus, the present invention makes it possible to easily form a fine pattern with a high accuracy.

While the invention has been described in detail and with reference to specific embodiments thereof, it will be apparent to one skilled in the art that various changes and modifications can be made therein without departing from the spirit and scope thereof.

We claim:

1. A process for forming an ultrafine pattern on a surface of a substrate, comprising the steps of: irradiating the surface of the substrate with radiation modulated according to an information to be patterned, subjecting the substrate surface to deposition to form deposited areas and non-deposited areas in correspondence with the non-irradiated areas and the irradiated areas, respectively, and subjecting the substrate surface to etching.

2. The process as claimed in claim 1, further comprising the step of heating said substrate after said step of subjecting said substrate surface to deposition.

3. The process as claimed in claim 1, wherein said substrate comprises a silicon wafer having coated thereon a silicon dioxide film, said silicon dioxide film being removed by said step of etching.

4. The process as claimed in claim 1, wherein said radiation comprises electron beams.

5. The process as claimed in claim 4, wherein electron beams are irradiated in a vacuum atmosphere containing a trace amount of an organic gas.

6. A process for forming an ultrafine pattern on a surface of a substrate, comprising the steps of: irradiating the surface of the substrate with radiation modulated according to information to be patterned, and depositing a material having reactivity to said substrate on a surface of said substrate.

7. The process as claimed in claim 6, further comprising the step of heating said substrate after said step of subjecting said substrate to deposition.

8. The process as claimed in claim 6, wherein the process further includes heating of the substrate during said step of depositing said material.

9. The process as claimed in claim 6, wherein said radiation comprises electron beams.

10. The process as claimed in claim 9, further comprising the step of providing a vacuum atmosphere containing a trace amount of an organic gas in which said step of irradiating is effected.

* * * * *